United States Patent [19]

Wilson

[11] Patent Number: 4,656,598
[45] Date of Patent: Apr. 7, 1987

[54] ALIAS DETECTOR FOR DIGITAL OSCILLOSCOPES

[75] Inventor: John R. Wilson, Colorado Springs, Colo.

[73] Assignee: Hewlett Packard Company, Palo Alto, Calif.

[21] Appl. No.: 668,776

[22] Filed: Nov. 6, 1984

[51] Int. Cl.⁴ .............................................. H03K 13/02
[52] U.S. Cl. ..................................... 364/550; 364/724; 340/347 SH
[58] Field of Search ............... 364/485, 576, 724, 726, 364/178, 179; 358/138; 340/347 SH; 324/77 B, 77 R

[56] References Cited

U.S. PATENT DOCUMENTS

| 3,156,899 | 11/1964 | Reich et al. | 340/347 SH |
| 4,143,365 | 3/1979 | Cayzac et al. | 340/347 SH |
| 4,222,077 | 9/1980 | Yamada | 340/347 SH |
| 4,283,713 | 8/1981 | Philipp | 340/347 SH |
| 4,313,195 | 1/1982 | Lehmann | 364/724 |
| 4,568,912 | 2/1986 | Kitamura et al. | 340/347 SH |

Primary Examiner—Parshotam S. Lall
Attorney, Agent, or Firm—John R. Stark; Karl E. Bring

[57] ABSTRACT

An alias detector for digital oscilloscopes is provided to detect inaccurate reconstructions of waveforms. Testing may be done according to the Nyquist criterion of a minimum of two points per period of the waveform or according to a user-specified criterion. The testing may be useful for detecting perceptual aliasing. The alias detector may automatically correct the error or display a warning to the user. The time frame for testing may be varied with reference to the time frame displayed to the user.

12 Claims, 6 Drawing Figures

ALIAS DETECTOR FOR DIGITAL OSCILLOSCOPES

BACKGROUND OF THE INVENTION

This invention is concerned generally with the application of sampling theory to waveform reconstruction, and more specifically to alias detection in digital oscilloscopes. Aliasing, an inherent problem in single shot analog to digital conversions, is an inaccurate reconstruction of a waveform caused by taking an insufficient number of samples per period of the signal being sampled. This misrepresentation, if not detected, can result in erroneous measurements being made. If detected, the sampling rate may be increased to a rate which enables accurate reconstruction of the original waveshape.

Systems well-known in the prior art were used to prevent Nyquist aliased signals from appearing on the user's display. These systems consisted of a series of switches and filters, which were used to filter out most signals faster than one-half the sampling frequency. The systems required changing the switches to change the filter when the sampling rate was changed. These systems could be cumbersome, expensive, and involved unattractive design trade-offs.

These systems could work well using ideal filters with infinite roll-off. But the practical implementation often fell short of the ideal. If the filter completely filtered out the aliased components, components that were not aliased were also filtered out and this reduced the usefulness of the system.

There were no alias detectors known in the prior art. For aliasing to be detected, the user had to notice irregularities in the reconstruction or display of the waveform, which sometimes didn't exist or appeared to be caused by something else, or the user would have to estimate the sampling rate required for accurate reconstruction from the frequency, which could not be done if the frequency was unknown. If the waveform shifted on the screen, a knowledgeable user might have understood that aliasing was a problem, but also could have attributed the problem to improper triggering. A user unfamiliar with aliasing would be at a loss to understand the problem. If the frequency of the waveform under test had been known, the appropriate sampling rate might have been estimated ahead of time to avoid aliasing. However, if the frequency was not known the user would not be able to estimate an appropriate sampling rate.

Nyquist's theorem states that if greater than two sample points per cycle of a waveform are obtained, then those samples contain enough information to accurately reconstruct the original waveshape. If fewer than two sample points per cycle are captured, then there is insufficient information to reconstruct the original waveshape.

SUMMARY OF THE INVENTION

One particular embodiment of the invention uses a frequency counter to determine the frequency count of a signal during an acquisition interval.

The frequency counter is enabled and disabled by a memory address counter which counts the number of sampling points acquired. When a predetermined number of sampling points have been acquired, the frequency count is compared to the predetermined number of sampling points. If the number of sampling points is greater than twice the frequency count, then aliasing is not present and no message is sent to the user. If the number of sampling points is not greater than twice the frequency count, a warning is displayed to the user.

The user may then increase the sample rate to provide sufficient data for accurate reconstruction of the waveform. This improves waveform analysis for users who may not realize there is a potential aliasing problem, and for users who have to either recognize a possible problem as aliasing, or compute estimations to avoid aliasing.

Other embodiments compare the frequency of the signal to the user's chosen criteria instead of the Nyquist criteria to determine if perceptual aliasing may be present. Another embodiment would increase the sampling rate automatically if either Nyquist aliasing or perceptual aliasing is occurring. Yet another embodiment allows the user to control when the test for aliasing will occur relative to the time frame displayed to the user.

DESCRIPTION OF THE PREFERRED EMBODIMENT

The alias detector is used to detect and flag incorrect electronic signal replication caused by acquiring an insufficient number of sampling points per cycle of a an electronic signal under test. A preferred embodiment is designed as an integral part of an oscilloscope which triggers on a single event, acquires 1024 points from a user-determined offset to the triggering event, and displays them to the user. The alias detector compares the sampling rate of the oscilloscope to the fundamental frequency of the signal under test according to Nyquist's criteria to determine if Nyquist aliasing is occurring. In another embodiment, the comparison is made according to user-specified criteria to determine if perceptual aliasing is occurring.

Figure 1A:
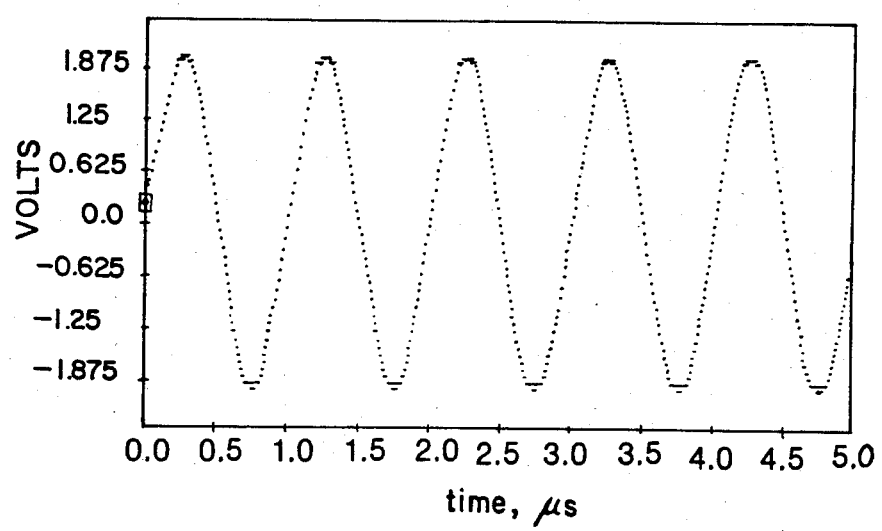
FIGS. 1A and 1B are graphs of a waveform under test and an aliased response.
Figure 1B:
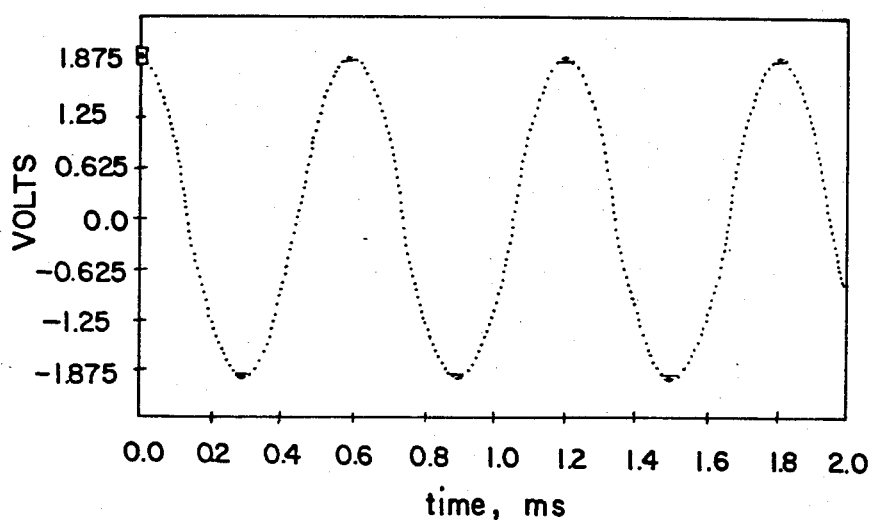

Nyquist's theorem states that if greater than two points per cycle of a waveform are known, then those samples contain enough information to accurately reconstruct the original waveshape. In practical terms, this requires a digital oscilloscope to acquire more than two points per cycle of a waveform to accurately reproduce the waveform. If less than two points per cycle of a waveform are acquired, the digital oscilloscope waveform reproduction may be inaccurate. In FIG. 1(A), a waveform is shown as accurately reconstructed by the digital oscilloscope. The Nyquist alias of the same waveform is shown in FIG. 1(B). Both waveforms appear acceptable to a user expecting to see a sine wave. The frequency of the waveform under test in both FIG. 1.(A) and FIG. 1.(B) is approximately 1.01 MHz. The frequency of the waveform displayed in FIG. 1 (A) appears to be approximately 1.0 MHz. The frequency of the waveform displayed in FIG. 1(B), however, appears to be approximately 1.66 kHz. The error in the waveform reconstruction of FIG. 1(B) occurred because the sampling rate was not fast enough to allow sufficient data to be acquired to accurately replicate the waveform under test. The sampling rate for FIG. 1(A), is 200 MHz, or approximately 200 points or samples per cycle. This is approximately 100 times the number of points needed to accurately reproduce the waveform. The sampling rate for FIG. 1(B) is 500 kHz, or approximately one point or sample for every two cycles. This is approximately one-quarter of the number of points needed to accurately reproduce the waveform. Since the sampling rate for the oscilloscope which produced the waveforms in FIG. 1(A) and FIG. 1(B) is always 1024 points per time frame, the frequency of the tested signal must be less than 512 cycles per time frame to avoid Nyquist aliasing.

In one embodiment, the alias test is performed on a time frame prior to the actual trigger point. In another embodiment, a delay counter is used to vary the testing time frame with reference to the time frame displayed to the user. Another embodiment automatically increases the sample rate until Nyquist aliasing no longer occurs.

Figure 2A:
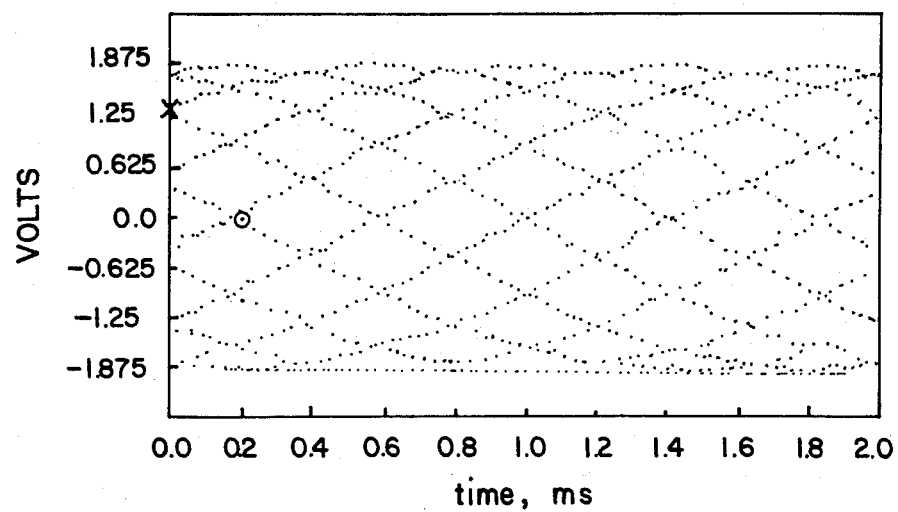
FIGS. 2A and 2B are graphs of a waveform under test and a perceptually aliased response.
Figure 2B:
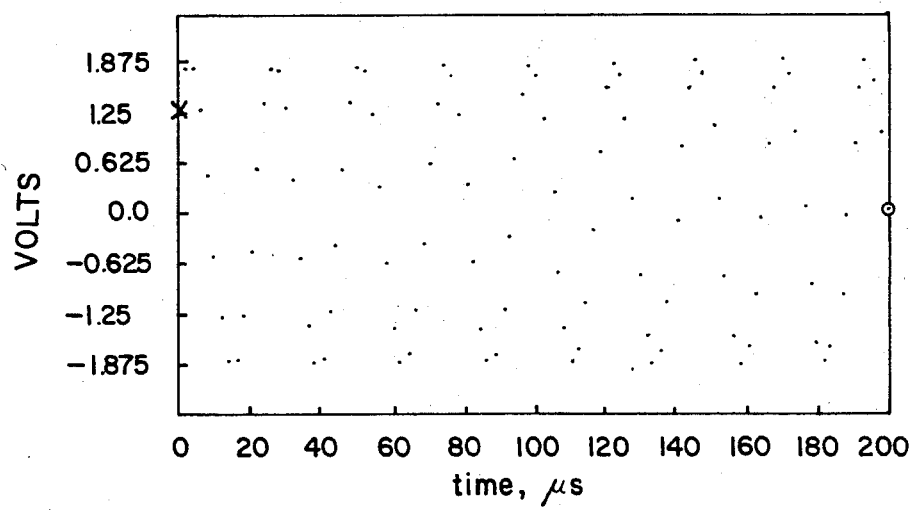

Perceptual aliasing occurs when the waveform is accurately replicated on the display by the oscilloscope, but the sampled points occur in such a fashion as to lead the user to make a visual misinterpretation. For example, if exactly four points per cycle of a sinusoidal wave were captured, at the maximum value, the minimum value, and the value where the waveform is equal to the dc offset, and the display scaling was set to cover a large amount of time relative to the period of the wave, the user would tend to see three horizontal lines on the display, one equal to the maximum value, one equal to the minimum value, and one equal to the dc offset, instead of seeing a sinusoidal wave with a frequency which is very fast compared to the time period displayed. More typically, a perceptual aliasing problem will appear as several distinct signals placed on the same display, as shown in FIG. 2(A). This replication may appear confusing to a user expecting a sine wave. The waveform is FIG. 2(A) has a frequency of approximately 41.9 kHz. The duration of the time frame is 2 ms. This means that between 80 and 90 cycles of the waveform are displayed in FIG. 2(A), In FIG. 2(B), the section of FIG. 2(A), between the X cursor and the 0 cursor has been expanded to present a less confusing view of the waveform. The duration of the time frame in this figure is 200 microseconds. Between 8 and 9 cycles of the waveform are displayed, allowing the waveform to be recognized more easily as a sine wave.

Increasing the number of points acquired per cycle may negate the possibility of perceptual aliasing. In one embodiment of the invention the user programs the oscilloscope to detect perceptual aliasing according to the user's criteria. If the user criterium was a minimum of 16 sampling points per cycle, and the number of sampling points for the time period was 1024, the maximum number of cycles for that time period would be 61. If the user criteria was a minimum of 20 sampling points per cycle, and the number of sampling points for that time period was 1024, then the maximum number of cycles for that time period would be 51. If perceptual aliasing as defined by the user's criteria is detected, the user could compensate for the problem by increasing the sampling rate or by decreasing the period of the display graph. Another embodiment would make these adjustments automatically.

Figure 3:
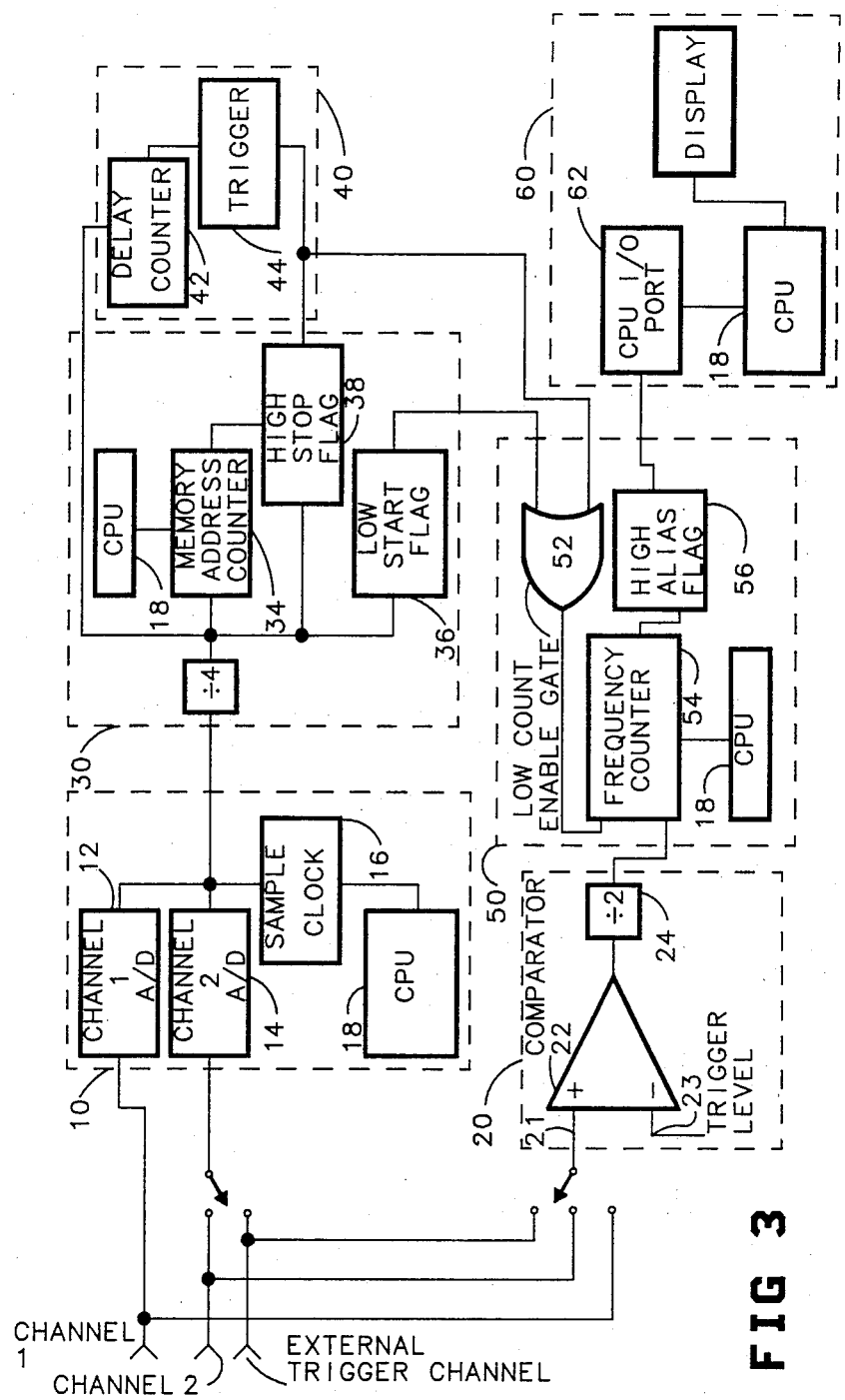
FIG. 3 is a block diagram of an alias detector according to one embodiment of the invention, specifically an alias detector for a digital oscilloscope.
Figure 4:
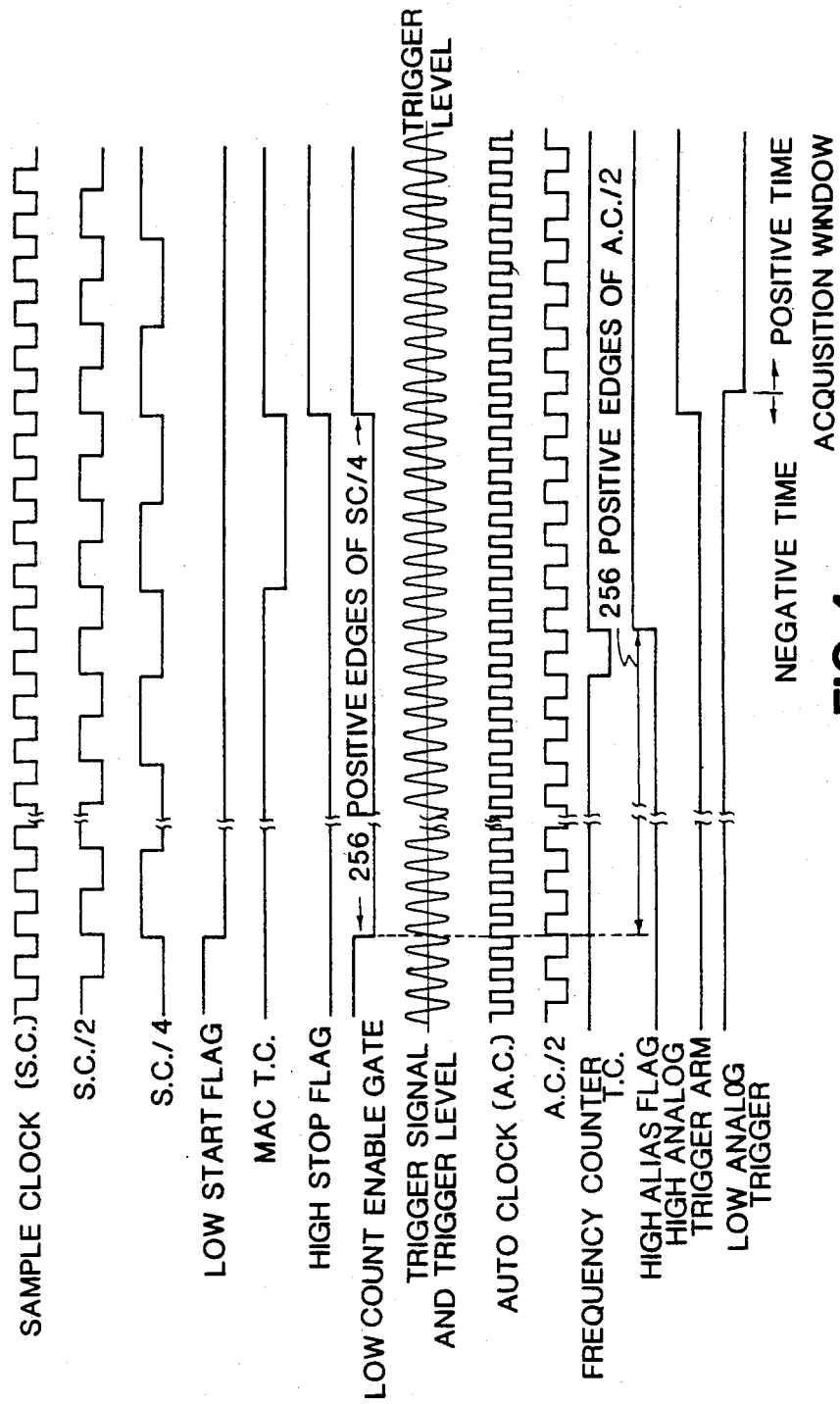
FIG. 4 is a timing diagram for the alias detector shown in FIG. 3.

The block diagram in FIG. 3 shows one embodiment of the invention as an integral part of an oscilloscope having two channels and an external trigger channel. Block 10 shows the analog-to-digital converters for channel 1 and channel 2, elements 12 and 14. A microprocessor (CPU), element 18, is responsible for coordinating the acquisition process. The master set line, not shown, is activated by the microprocessor prior to the acquisition process to set the initial conditions for the flags and counters. Once the acquisition process begins, the microprocessor starts the sample clock, element 16. The clock enables the analog-to-digital converters to take samplings at the user-determined sampling rate. The sample clock output, which is a series of clocking pulses as shown in FIG. 4, also goes to block 30. Block 10 shows some components being used in the oscilloscope during alias testing and sampling.

In block 20, the incoming signal or waveform to be tested is converted to a square wave signal with a fundamental frequency equal to the fundamental frequency of the incoming signal. The incoming signal enters block 20 on line 21 and enters a comparator, element 22. On line 23, the signal is the trigger level set by the user. The output of the comparator is two-valued, high when the input on line 21 is greater than the input on line 23, and low when the input on line 23 is greater than the input on line 2. If the user chooses a trigger level properly, the value of the comparator will toggle between high and low at the same frequency as the fundamental frequency of the waveform to be tested. This produces a square wave version of the incoming signal called the AUTOCLOCK (A.C.). An example of a TRIGGER SIGNAL and a TRIGGER LEVEL is shown in FIG. 4, along with the corresponding AUTOCLOCK. The AUTOCLOCK feeds into a divide-by-two unit, element 24, and is divided by two, as shown in FIG. 4 as the A.C./2.

In block 30, the start flag for the frequency counter is enabled which begins the acquisition interval, the number of samples to be taken after the start of the acquisition interval is counted, and then the stop flag is enabled ending the acquisition interval. The sample clock output from the sample clock, element 16 in block 10, is the input for a divide-by-four unit, element 32 in block 30. Actually, the divide-by-four unit is two divide-by-two units in series. The timing diagram of FIG. 4 shows the output of the various stages as the SAMPLE CLOCK (S.C.), the S.C./2, and the S.C./4. The output of the divide-by-four, S.C./4, has one leading edge and one falling edge for every 4 leading edges and 4 falling edges of the SAMPLE CLOCK. The output S.C./4 goes to the Low Start Flag, element 36, which goes low on the first leading edge of the S.C./4 clock. The Start Flag was set high when the CPU, element 18, pulsed the master set prior to the beginning of the acquisition interval. The Start Flag can be a D-type flip-flop in a latch configuration. A D-type flip-flop is a logical unit with 5 inputs and 2 outputs. The primary output is Q, and the other output is $\bar{Q}$, the inverse of Q. The first two inputs are the D input and the clock input. On the leading edge of the clock pulse, Q becomes whatever D was just prior to the clock's leading edge. The Q output remains constant until the next leading edge of the clock, when it becomes whatever D was prior to the clock leading edge again. The third input is the enable. When the flip-flop is enabled, it responds to the D input and clock input. When it is not enabled, the D-type flip-flop has a constant output on Q of whatever Q was prior to the enable.

The last two inputs, the set and the reset, are for setting the initial conditions of the flip-flop. A positive pulse on the set makes the Q output high; a positive pulse on the reset makes the Q output a zero, bypassing the D input and clock input, and placing an initial condition on Q prior to the first leading edge of the clock. The Low Start Flag is always enabled. The D input is pinned low. The clock input is S.C./4, the output of the divide-by-four unit, element 32. When the CPU pulses the master set, the set on the D-type flip-flop is enabled and the initial condition of high is placed on Q. Therefore, Q is initially set high, and it stays there until the first leading edge of the divide-by-four unit, S.C./4, as shown at Low Start Flag in FIG. 4. Then Q becomes whatever the D input was prior to the clock edge, which was zero or low. Since the D input is tied low, the output will not change on any later leading edges of the clock but will remain low till the CPU sets the latch prior to the start of another acquisition interval, as shown in the timing diagram at Low Start Flag in FIG. 4.

The divide-by-four unit output is also used to clock an 8-bit memory address counter, element 34, which has been preset to zero by the CPU, element 18. When the memory address counter reaches 256, a terminal count indicator is enabled low for one S.C./4 pulse as shown in the timing diagram of FIG. 4 at MAC T.C. (memory address counter terminal count).

The acquisition interval may vary in length of time but the number of samples taken during the interval, 1024, is always the same for this embodiment. Since the memory address counter counts once for every four sample clock pulses, it will have counted 1024 samples when it reaches 256 and enables the terminal count low. The memory address counter is used to stop the frequency counter at the end of the acquisition interval.

The High Stop Flag, element 38, can be a D-type flip-flop similar to the Low Start Flag, also set up in a latch configuration. In the High Stop Flag, the enable is the terminal count of the memory address counter, MAC T.C., and will only allow the latch to function when the MAC T.C. goes low as shown at High Stop Flag in FIG. 4. The D input is pinned low, the clock input is the S.C./4, the output is $\overline{Q}$, the inverse of Q, and the set is on the master set line from the CPU. This means $\overline{Q}$ or the High Stop Flag will be set low prior to the beginning of the acquisition interval by the master set, and will be enabled by the memory address counter terminal count, MAC T. C., and will go high on the next leading edge of the clock input during enablement, which will be the 256th positive edge of S.C./4. The stop flag will remain high until the Q output is set by the master set of the CPU, element 18.

In the embodiment shown in FIG. 3, the output from the Stop Flag goes to the trigger, element 44 in block 40. When the High Stop Flag output goes high on the 256th leading edge of S.C./4, it also enables the trigger to look for the triggering event defined by the user as shown at High Analog Trigger Arm in FIG. 4. When the triggering event occurs, the trigger output signals the delay counter, element 42, to count the delay specified by the user, and then stop the acquistion there as shown at Low Analog Trigger in FIG. 4. The display will show points sampled during the acquisition interval, which is immediately prior to the end of the delay counted by the delay counter element 42.

In block 50, both LOW START FLAG and HIGH STOP FLAG enter the Low Count Enable Gate which is element 52, a two-input OR gate. The OR gate output is high whenever one input or the other input or both inputs are high. Only when both inputs are low is the output low. Since the initial state of the Low Start Flag is high, and the initial state of the High Stop Flag is low, the OR gate output is high. When the LOW START FLAG goes low, the OR gate output, or Low Count Enable Gate, goes low and stays low until the HIGH STOP FLAG goes high. The output of the Low Count Enable Gate is shown in FIG. 4, the timing diagram.

The frequency counter, element 54, can be an 8-bit counter similar to the memory address counter, element 34. Prior to the start of the acquisition period, the frequency counter will have been reset to zero by the CPU, element 18. The frequency counter is enabled only while the LOW COUNT ENABLE GATE is low. The frequency counter will count the pulses on the clock line during the time that it is enabled. The clock line is A.C./2 and has one pulse for every two cycles of the waveform under test, TRIGGER SIGNAL. When the frequency count reaches 256, the terminal count line will be enabled low, as shown at FREQUENCY COUNTER T.C., in FIG. 4, the timing diagram. If there are more than 512 cycles of the waveform under test, which is equivalent to 256 A.C./2 pulses, the terminal count will go low for one clock pulse.

When the FREQUENCY COUNTER T.C. goes high after going low, the High Alias Flag, element 56, will be latched high indicating an aliased condition exists. The High Alias Flag may be a latch built with a D-type flip-flop, similar to the Low Start Flag and the High Stop Flag. The FREQUENCY COUNTER T.C. would be the enable of the flip-flop. The set would be connected to the master set line. The D input would always be low. The clock would be the A.C./2. The Q line would start high, and then go low and stay there till the master set is pulsed again. The $\overline{Q}$ line or HIGH ALIAS FLAG, would be the output to block 60. The HIGH ALIAS FLAG would start low, and then go high, complementing the Q output as shown in FIG. 4.

The HIGH ALIAS FLAG is sent to the CPU I/O port, element 62, where the CPU, element 18, is looking for the HIGH ALIAS FLAG. The CPU interprets the high state of the HIGH ALIAS FLAG as meaning that the sample rate is too slow and a Nyquist aliased condition exists. The CPU then displays an alias warning to the user. The user may not have been aware of the false replication of the waveform and the alias warning prompts the user to increase the sampling rate and force accurate replication of TRIGGER SIGNAL, the waveform under test.

In another embodiment, the CPU, element 18, increases the sampling rate automatically until the signal is not aliased, instead of displaying a warning to the user. This could be readily implemented through the CPU software. As the HIGH ALIAS FLAG is enabled, the CPU increases the sampling rate and tests the HIGH ALIAS FLAG. If it is enabled at the end of another acquisition interval, the sampling rate is increased again. This process continues until the HIGH ALIAS FLAG indicates that aliasing is not occurring. The sampling rate could be displayed to the user so that the user is aware of the change in sampling rate. Another embodiment would compute the correct sampling rate and implement it automatically.

An alternate embodiment could allow the user to test for perceptual aliasing according to the user's own criteria. A test for perceptual aliasing could be made by comparing the sampling rate against the frequency of the incoming signal, according to user-specified criterion, for example, 16 points per cycle or 20 points per cycle. If the criterion was met, the display would be more likely to replicate the waveform without causing a perceptual aliasing problem to the user. If the comparison fails the user criterion, a warning could be displayed to the user, or the sampling rate could be automatically increased to allow the user-programmed perceptual aliasing criterion to be met.

In one embodiment, the alias testing may occur during a time frame prior to the time frame displayed to the user. By using a delay counter, the alias testing may be done for the time frame actually displayed to the user, or for a time frame occurring after the time frame displayed to the user. The delay counter could be used to begin or end the acquisition period in reference to the beginning or end of the alias test period. The length of the delay could be set by the user.

These embodiments allow a user to test for Nyquist or perceptual aliasing, to test before, during, or after the time frame displayed to the user, and correct the problem manually or automatically.

What is claimed is:

1. An alias detector for detecting and flagging incorrect electronic signal replication caused by using an insufficient number of sampling points, comprising:
   frequency means for determining the fundamental frequency of an electronic signal in a system under test for a predetermined acquisition interval having a beginning and an end;
   comparison means connected to the frequency means for determining whether a selected number of sampling points is greater than two times said fundamental frequency of said signal; and
   flag means connected to said comparison means for indicating the result of the determination made by said comparison means.

2. An alias detector as recited in claim 1, wherein said frequency means comprises:
   autoclocking means for converting said electronic signal under test to a square wave signal;
   autoclock counting means connected to said autoclocking means for counting cycles of said square wave signal;
   switching means connected to said autoclock counting means for enabling said autoclock counting means at said beginning of said predetermined sampling period and for disabling said autoclock counting means at said end of said predetermined sampling period; and
   sample clocking means connected to said switching means for clocking said switching means during said predetermined acquisition interval period.

3. An alias detector as recited in claim 2, wherein said autoclocking means comprises:
   comparator means, having a first input, a second input, and an output, said first input being said signal under test, said second input being a trigger level, and said output having a first value when said first input is greater than said second input and a second value when said second input is greater than said first input, for converting said electronic signal to said square wave signal.

4. An alias detector as recited in claim 3, wherein said switching means comprises:
   interval counting means connected to said sample clocking means for counting cycles of said clocking means during said predetermined acquisition interval and for signaling said end of said predetermined acquisition interval;
   start flag means connected to said autoclock counting means and said sample clocking means for enabling said autoclock counting means at said beginning of said predetermined sampling period;
   stop flag means connected to said interval counting means and said autoclock counting means for disabling said autoclock counting means at said end of said predetermined acquisition interval.

5. An alias detector as recited in claim 1, wherein said flag means comprises:
   microprocessor means for sending a warning display to user when said determination by said comparison means is negative;
   latch means connected to said microprocessor means and said comparison means for relaying result of said determination by said comparison means.

6. An alias detector as recited in claim 1, wherein said flag means comprises:
   microprocessor means for increasing said sample rate when said determination by said comparison means is negative; latch means connected to said microprocessor means and said comparison means for communicating result of said determination of said comparison means.

7. An alias detector for detecting and flagging user-defined perceptually aliased conditions, comprising;
   frequency means for determining the fundamental frequency of an electronic signal under test for a predetermined acquisition interval having a beginning and an end;
   comparison means connected to said frequency means for determining whether a preselected number of sampling points is greater than a user-determined multiple of said frequency of said electronic signal; and
   flag means connected to said comparison means for indicating the result of the determination made by said comparison means.

8. An alias detector as recited in claim 7, wherein said frequency means comprises:
   autoclocking means for converting said electronic signal under test to a square wave signal;
   autoclock counting means connected to said autoclocking means for counting cycles of said square wave signal;
   switching means connected to said autoclock counting means for enabling said autoclock counting means at said beginning of said predetermined acquisition interval and for disabling said autoclock counting means at said end of said predetermined acquisition interval; and
   sample clocking means connected to said switching means for clocking said switching means during said predetermined acquisition interval.

9. An alias detector as recited in claim 8, wherein said autoclocking means comprises:
   comparator means, having a first input, a second input, and an output, said first input being said signal under test, said second input being a trigger level, and said output having a first value when said first input is greater than said second input and a second value when said second input is greater than said first input, for converting said electronic signal to said square wave signal.

10. An alias detector as recited in claim 9, wherein said switching means comprises:

interval counting means connected to said sample clocking means for counting cycles of said clocking means during said predetermined acquisition interval and for signaling said end of said predetermined acquisition interval;

start flag means connected to said autoclock counting means and said sample clocking means for enabling said autoclock counting means at said beginning of said predetermined acquisition interval;

stop flag means connected to said interval counting means and said autoclock counting means for disabling said autoclock counting means at said end of said predetermined sampling period.

11. An alias detector as recited in claim 7, wherein said flag means comprises:

microprocessor means for sending a warning display to user when said determination by said comparison means is negative;

latch means connected to said microprocessor means and said comparison means for relaying result of said determination by said comparison means.

12. An alias detector as recited in claim 7, wherein said flag means comprises:

microprocessor means for increasing said sample rate when said determination by said comparison means is negative;

latch means connected to said microprocessor means and said comparison means for communicating result of said determination of said comparison means.

* * * * *